(12) United States Patent
Chen (10) Patent No.: US 12,280,399 B2
(45) Date of Patent: Apr. 22, 2025

(54) METHOD FOR MANUFACTURING AN ACOUSTIC WAVE TRANSDUCING UNIT

(71) Applicant: BOE Technology Group Co., Ltd., Beijing (CN)

(72) Inventor: Yuju Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 798 days.

(21) Appl. No.: 17/426,863

(22) PCT Filed: Oct. 27, 2020

(86) PCT No.: PCT/CN2020/123921
§ 371 (c)(1),
(2) Date: Jul. 29, 2021

(87) PCT Pub. No.: WO2022/087813
PCT Pub. Date: May 5, 2022

(65) Prior Publication Data
US 2022/0314277 A1   Oct. 6, 2022

(51) Int. Cl.
| | | |
|---|---|---|
| *H04R 1/00* | (2006.01) | |
| *B06B 1/06* | (2006.01) | |
| *H10N 30/05* | (2023.01) | |
| *H10N 30/09* | (2023.01) | |
| *H10N 30/87* | (2023.01) | |
| *H10N 30/88* | (2023.01) | |

(52) U.S. Cl.
CPC ............... *B06B 1/06* (2013.01); *H10N 30/05* (2023.02); *H10N 30/09* (2023.02); *H10N 30/87* (2023.02); *H10N 30/88* (2023.02)

(58) Field of Classification Search
CPC ...... B06B 1/06; B06B 1/0688; H10N 30/853; H10N 30/87; H10N 30/88; H10N 30/05; H10N 30/074; H10N 30/082; H10N 30/09; H10N 30/2047; H10N 30/302; H10N 30/708
See application file for complete search history.

(56) References Cited

U.S. PATENT DOCUMENTS

| | | | |
|---|---|---|---|
| 4,838,088 A * | 6/1989 | Murakami ............ | G01L 9/0073 361/283.4 |
| 11,787,688 B2 * | 10/2023 | Lee ........................ | G01L 9/0042 438/53 |

* cited by examiner

*Primary Examiner* — Paul D Kim
(74) *Attorney, Agent, or Firm* — Nath, Goldberg & Meyer; Joshua B. Goldberg (57) ABSTRACT

A method for manufacturing an acoustic wave transducing unit including: forming a first electrode on a substrate; sequentially forming a supporting layer and a diaphragm layer on a side of the first electrode away from the substrate, the first electrode being lattice-matched with the supporting layer, the supporting layer being lattice-matched with the diaphragm layer, a Photon Energy of the supporting layer is smaller than that of the diaphragm layer; the supporting layer including a sacrificial portion and a supporting portion surrounding the sacrificial portion; forming a release hole penetrating through at least the diaphragm layer and being in contact with the sacrificial portion; performing a laser etching on the sacrificial portion to decompose the sacrificial portion into a metal simple substance and a gas; and removing the metal simple substance through the release hole so as to form a vibration chamber at a position of the sacrificial portion.

10 Claims, 7 Drawing Sheets

METHOD FOR MANUFACTURING AN ACOUSTIC WAVE TRANSDUCING UNIT

This is a National Phase Application filed under 35 U.S.C. 371 as a national stage of PCT/CN2020/123921, filed Oct. 27, 2020, the content of which is hereby incorporated by reference in its entirety.

TECHNICAL FIELD

The present disclosure relates to the field of acoustic wave transduction technology, in particular to an acoustic wave transducing unit, a method for manufacturing an acoustic wave transducing unit, and an acoustic wave transducer.

BACKGROUND

Ultrasonic detection has been applied in medical imaging, therapy, industrial flowmeters, automotive radars, indoor positioning, and other aspects. An acoustic wave transducer is a device which can be used for ultrasonic detection, and an acoustic wave transducing unit is a core element in the acoustic wave transducer.

SUMMARY

Aspects of the present disclosure propose an acoustic wave transducing unit, a method for manufacturing an acoustic wave transducing unit, and an acoustic wave transducer.

In a first aspect, an embodiment of the present disclosure provides an acoustic wave transducing unit, including:
 a substrate;
 a first electrode located on the substrate;
 a supporting portion located on a side of the first electrode away from the substrate;
 a diaphragm layer located on a side of the supporting portion away from the substrate;
 a release hole, which at least penetrates through the diaphragm layer;
 where the supporting portion, the diaphragm layer and the first electrode define a vibration chamber, the vibration chamber is communicated with the release hole, the supporting portion is lattice-matched with the first electrode, and the supporting portion is lattice-matched with the diaphragm layer; a material of the supporting portion is capable of being decomposed into a metal simple substance and a gas under an action of laser; a Photon Energy of the supporting portion is smaller than that of the diaphragm layer.

In some implementations, the substrate is a glass substrate, a material of the first electrode includes molybdenum, a material of the supporting layer includes gallium nitride, and a material of the diaphragm layer includes aluminum nitride.

In some implementations, the acoustic wave transducing unit further includes: a lattice buffer layer located between the first electrode and the supporting portion, the lattice buffer layer being at least lattice-matched with the supporting portion.

In some implementations, an orthogonal projection of the lattice buffer layer on the substrate coincides with an orthogonal projection of the supporting portion on the substrate.

In some implementations, a material of the lattice buffer layer includes zinc oxide.

In a second aspect, an embodiment of the present disclosure provides an acoustic wave transducer, which includes a plurality of acoustic transducing array elements, each of which includes at least one acoustic wave transducing unit described above.

In a third aspect, an embodiment of the present disclosure provides a method for manufacturing an acoustic wave transducing unit, including:
 forming a first electrode on a substrate;
 sequentially forming a supporting layer and a diaphragm layer, where the supporting layer is located on a side of the first electrode away from the substrate, and the diaphragm layer is located on a side of the supporting layer away from the substrate; the first electrode is lattice-matched with the supporting layer, the supporting layer is lattice-matched with the diaphragm layer, and a Photon Energy of the supporting layer is smaller than that of the diaphragm layer; the supporting layer includes a sacrificial portion and a supporting portion surrounding the sacrificial portion;
 forming a release hole, where the release hole at least penetrates through the diaphragm layer and is in contact with the sacrificial portion;
 performing a laser etching on the sacrificial portion to decompose the sacrificial portion into a metal simple substance and a gas; and
 removing the metal simple substance through the release hole so as to form a vibration chamber at a position of the sacrificial portion.

In some implementations, the substrate is a glass substrate, a material of the first electrode includes molybdenum, a material of the supporting layer includes gallium nitride, and a material of the diaphragm layer includes aluminum nitride.

In some implementations, during performing the laser etching on the sacrificial portion, a laser having a wavelength ranging from 245 nm to 250 nm and an energy density ranging from 1.0 J/cm$^2$ to 1.5 J/cm$^2$ is used.

In some implementations, the forming the supporting layer includes: forming a supporting material layer by adopting a sputtering process, and performing a patterning process on the supporting material layer to form a pattern of the supporting layer;
 parameters of the sputtering process for forming the supporting material layer include:
 a material of a sputtering target including gallium nitride;
 a sputtering power ranging from 100 W to 200 W;
 a process gas including a first inert gas, and a flow rate of the first gas ranging from 10 sccm to 50 sccm.

In some implementations, the forming the diaphragm layer includes: forming a diaphragm material layer by adopting a sputtering process, and performing a patterning process on the diaphragm material layer to form a pattern of the diaphragm layer;
 parameters of the sputtering process for forming the diaphragm material layer include:
 a material of a sputtering target including aluminum;
 a sputtering power ranging from 25 W to 100 W;
 a process gas including nitrogen and a second inert gas, both of which having a flow rate ranging from 4 sccm to 6 sccm.

In some implementations, the removing the metal simple substance through the release hole includes:
 introducing etching liquid into the release hole to etch away the metal simple substance.

In some implementations, the method further includes: forming a lattice buffer layer between the supporting layer and the first electrode, the lattice buffer layer being at least lattice-matched with the supporting layer.

In some implementations, a material of the lattice buffer layer includes zinc oxide.

In some implementations, forming the lattice buffer layer includes: forming a lattice buffer material layer by adopting a sputtering process, and performing a patterning process on the lattice buffer material layer to form a pattern of the lattice buffer layer;

parameters of the sputtering process for forming the lattice buffer material layer include:
a material of a sputtering target including zinc oxide;
a sputtering power ranging from 100 W to 150 W;
a process gas including a third inert gas, and a flow rate of the third inert gas ranging from 10 sccm to 20 sccm.

DRAWINGS

The accompanying drawings, which are included to provide a further understanding of the disclosure and are incorporated in and constitute a part of this specification, illustrate embodiments of the disclosure and together with the description serve to explain the disclosure, but do not constitute a limitation of the disclosure. In the drawings.

DETAILED DESCRIPTION

The specific embodiments of the present disclosure are described in detail below in combination with the accompanying drawings. It should be understood that the specific embodiments described herein are only used to illustrate and explain the present disclosure and are not used to limit the present disclosure.

A piezoelectric ultrasonic sensor is an acoustic-electric conversion device which is widely applied. However, a piezoelectric sensor in the related art is not a high-efficiency ultrasonic source because of a phenomenon of serious decoupling between air and a common piezoelectric material. The efficiency of the piezoelectric sensor can be improved by adding a coupling layer between the air and the piezoelectric material, but in such way, a reduced sensor bandwidth is resulted in At present, with development of MEMS (Micro Electro Mechanical Systems) technology, a completely new ultrasonic sensor, i.e., a capacitive micromachined ultrasonic sensor (cMUT) has appeared. The capacitive micromachined ultrasonic sensor adopts surface micromachining and other micromachining processes, can well overcome many defects of the piezoelectric sensor in the related art, and has advantages of easy to be manufactured, small size, low noise, large operating temperature range, easy to realize electronic integration and the like.

Figure 1A:
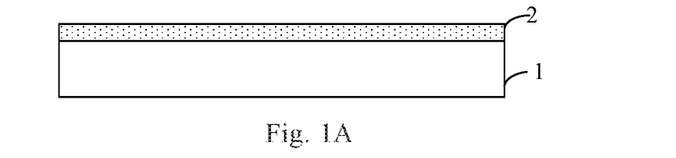
FIGS. 1A to 1G are diagrams illustrating a process of manufacturing an acoustic wave transducing unit provided in an example.

A core element in the acoustic-electric conversion device is an acoustic wave transducing unit, and FIGS. 1A to 1G are diagrams illustrating a process of manufacturing an acoustic wave transducing unit provided in an example, as shown in FIGS. 1A to 1G, a method for manufacturing the acoustic wave transducing unit includes:

as shown in FIG. 1A, forming a supporting layer 2 on a first substrate 1.

Figure 1B:
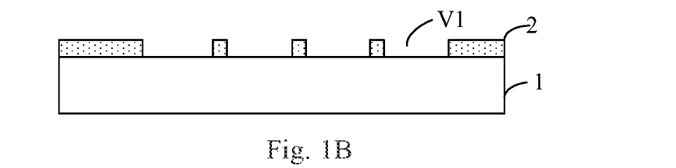

Thereafter, as shown in FIG. 1B, the supporting layer 2 is subjected to a patterning process to form a receiving groove V1.

Figure 1C:
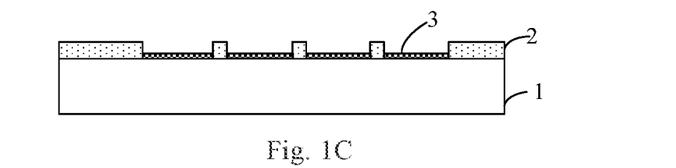

Then, as shown in FIG. 1C, a first electrode 3 is formed in the receiving groove V1.

Figure 1D:
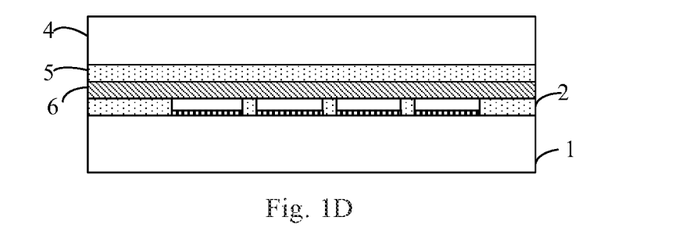

In addition, the method further includes: sequentially forming a buffer layer 5 and a diaphragm material layer 6 on a second substrate 4; thereafter, as shown in FIG. 1D, the first substrate 1 and the second substrate 2 are disposed opposite to each other, and the supporting layer 2 on the first substrate 1 and the diaphragm material layer 6 on the second substrate 4 are coupled together. It should be noted that, in practice, before the first substrate 1 and the second substrate 2 are disposed opposite to each other, metal layers (although not shown in FIG. 1D) may be respectively formed on the supporting layer 2 and the diaphragm material layer 6, and then the supporting layer 2 and the diaphragm material layer 6 are coupled together by bonding the metal layers to each other; alternatively, a thin adhesive layer may be provided on the supporting layer 2 and/or the diaphragm material layer 6, and the supporting layer 2 and the diaphragm material layer 6 are bonded together through the adhesive layer.

Figure 1E:
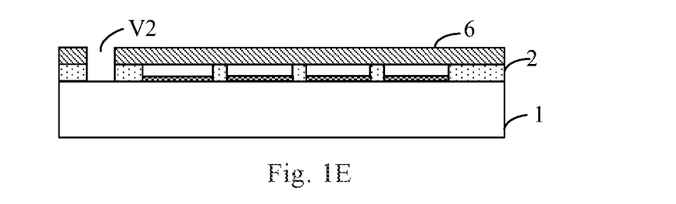

Thereafter, as shown in FIG. 1E, the second substrate 4 and the buffer layer 5 are removed, and a via hole V2 is formed.

Figure 1F:
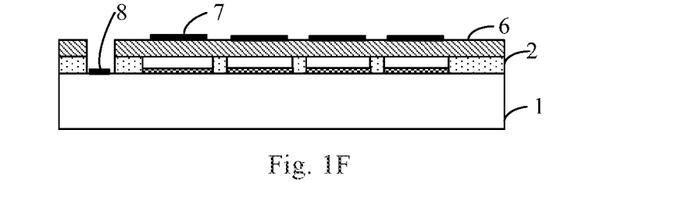

After that, as shown in FIG. 1F, a second electrode 7 and a lead wire 8 coupled to the first electrode 3 are formed.

Figure 1G:
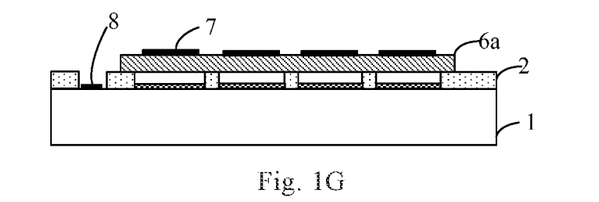

Finally, as shown in FIG. 1G, the diaphragm material layer 6 is etched and modified to obtain a final diaphragm pattern 6a.

In the above manufacturing process, the supporting layer 2 is made of silicon nitride, silicon oxide, or the like, so as to reduce the manufacturing cost. In order to prevent the first substrate 1 from being damaged during a process of etching the supporting layer 2, a silicon substrate, rather than a glass substrate, is generally used as the first substrate 1. Since the silicon substrate is relatively small in size, it is difficult to manufacture a large-scale array type acoustic wave transducing unit.

Figure 2A:
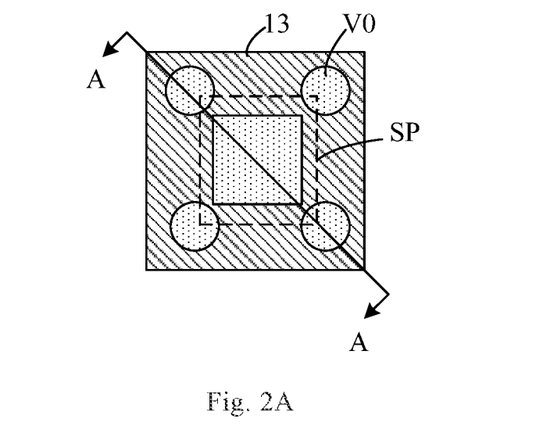
FIG. 2A is a top view of an acoustic wave transducing unit provided in some embodiments of the present disclosure.
Figure 2B:
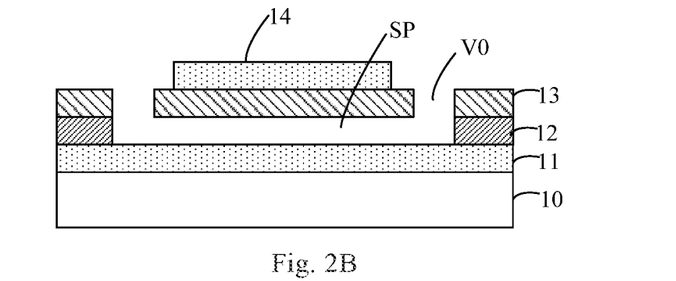
FIG. 2B is a cross-sectional view taken along line A-A in FIG. 2A.
Figure 2C:
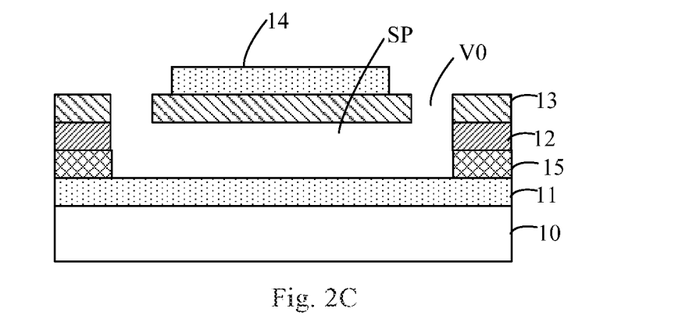
FIG. 2C is another cross-sectional view taken along line A-A in FIG. 2A.

An embodiment of the present disclosure provides an acoustic wave transducing unit, where FIG. 2A is a top view of an acoustic wave transducing unit provided in some embodiments of the present disclosure, FIG. 2B is a cross-sectional view taken along line A-A in FIG. 2A, and FIG. 2C is another cross-sectional view taken along line A-A in FIG. 2A, as shown in FIGS. 2A to 2C, the acoustic wave transducing unit includes: a substrate 10, a first electrode 11, a supporting portion 12 and a diaphragm layer 13. The acoustic wave transducing unit further includes a release hole V0, the release hole V0 penetrating at least the diaphragm layer 13. The first electrode 11 is disposed on the substrate 10, the supporting portion 12 is located on a side of the first electrode 11 away from the substrate 10, and the diaphragm layer 13 is located on a side of the supporting portion 12 away from the substrate 10. The supporting portion 12, the diaphragm layer 13 and the first electrode 11 define a vibration chamber SP, which communicates with the release hole V0. In some implementations, there may be a plurality of release holes V0, and the vibration chamber SP communicates with the plurality of release holes V0 at the same time. Shapes of the release hole V0 and the vibration chamber SP are not limited in the embodiment of the present disclosure, for example, a shape of an orthographic projection of the release hole V0 on the substrate 10 is a circle, and a shape of an orthographic projection of the vibration chamber SP on the substrate 10 is a square; for another example, shapes of the orthographic projection of the release hole V0 on the substrate 10 and the orthographic projection of the vibration chamber SP on the substrate 10 are both polygons such as a hexagon and an octagon; for another example, the shapes of the orthographic projection of the release hole V0 on the substrate 10 and the orthographic projection of the vibration chamber SP on the substrate 10 are both circular.

The supporting portion 12 is lattice-matched with the first electrode 11, and the supporting portion 12 is lattice-matched with the diaphragm layer 13. The material of the supporting portion 12 can be decomposed into a metal simple substance and a gas under an action of laser; Photon Energy, i.e., ultraviolet (UV) absorption, of the supporting portion 12 is smaller than that of the diaphragm layer 13. In some implementations, the substrate 10 is a glass substrate 10, and the acoustic wave transducing unit further includes a second electrode 14, where the second electrode 14 is disposed on a side of the diaphragm layer 13 away from the substrate 10.

In the embodiment of the present disclosure, the supporting portion 12 can be decomposed into a metal simple substance and a gas under the action of laser, and the Photon Energy of the supporting portion 12 is smaller than that of the diaphragm layer 13, therefore, when the acoustic wave transducing unit is manufactured, the first electrode 11 and a supporting layer may be formed on the substrate 10, a portion of the supporting layer in a region where the vibration chamber is to be formed is subjected to laser etching to be decomposed into a metal simple substance and a gas, and then the metal simple substance is removed to form the vibration chamber SP, and the remaining portion of the supporting layer is the supporting portion 12. Therefore, when the supporting layer is decomposed by laser and the metal simple substance is removed, the glass cannot be influenced, so that the acoustic wave transducing unit can be manufactured on the glass substrate, and a large-scale array type acoustic wave transducing unit can be manufactured conveniently.

It should be noted that "lattice-matched" of two film layers in the embodiment of the present disclosure means that lattice structures of the two film layers are the same, and lattice coefficients of the two film layers are similar or the same, for example, a difference between lattice constants of the two film layers is less than 0.03 nm.

In some implementations, a material of the first electrode 11 may be molybdenum (Mo), molybdenum alloy, titanium (Ti), titanium nitride (TiN x), or other metal. In a specific example, the material of the first electrode 11 includes molybdenum, and a material of the diaphragm layer 13 includes aluminum nitride (AlN). Aluminum nitride has piezoelectric properties and relatively low dielectric loss (dielectric loss refers to a phenomenon that the dielectric itself heat due to consuming part of electric energy in an alternating electric field., the reason for dielectric heating is that the dielectric contains conductive carriers, which can generate, under an action of an external electric field, a conductive current and consume part of electric energy, and the consumed electric energy can be converted into heat energy). In the embodiment of the present disclosure, the diaphragm layer 13 may be made of aluminum nitride, so as to improve the heat dissipation performance of the acoustic wave transducing unit.

Table 1 is a table of characteristic parameters of various piezoelectric materials, and shows piezoelectric characteristic parameters of lead zirconate titanate piezoelectric ceramic (PZT), lithium niobate (LiNbO$_3$), aluminum nitride (AlN), and zinc oxide (ZnO), and the piezoelectric characteristic parameters include: piezoelectric constant, piezoelectric coefficient, Electromechanical coupling coefficient, Elastic modulus, Hardness, Resistivity, Thermal expansion characteristic, Acoustic velocity, and Dielectric loss angle tan. As can be seen from Table 1, aluminum nitride is excellent in various electrical properties.

TABLE 1

| characteristics | PZT | LiNbO$_3$ | AlN | ZnO |
|---|---|---|---|---|
| piezoelectric constant (C/m$^2$) | $e_{31} = -6.5$ $e_{33} = 23.3$ | $e_{31} = 0.23$ $e_{33} = 1.33$ | $e_{31} = -0.58$ $e_{33} = 1.55$ | $e_{31} = -0.57$ $e_{33} = 1.32$ |
| Piezoelectric coefficient (pm/V) | $d_{31} = -120\sim-170$ $d_{33} = 60\sim130$ | $d_{31} = -7.4$ | $d_{31} = -2.0$ $d_{33} = 3.9$ | $d_{31} = -5.0$ $d_{33} = 5.9$ |
| Electromechanical coupling coefficient k$^2$ | 0.57~0.69 | 5.5 | 0.24 | 0.33 |
| Elastic modulus (Gpa) | 68 | 203 | 308 | 201 |
| Hardness (Gpa) | 8.0 | — | 17 | 5.0 |
| Resistivity (Ω cm) | $1 \times 10^9$ | $2 \times 10^{10}$ | $1 \times 10^{11}$ | $1 \times 10^7$ |
| Thermal expansion characteristic α (/° C.) | $2 \times 10^{-6}$ | $1.5 \times 10^{-5}$ | $4.3 \times 10^{-6}$ | $6.5 \times 10^{-6}$ |
| Acoustic velocity (m/s) | 3900 | 3980 | 10127 | 5700 |
| Dielectric loss angle tan (10$^5$ V/m) | 0.01~0.03 | — | 0.003 | 0.01~0.1 |

When the diaphragm layer 13 is made of aluminum nitride and the first electrode 11 is made of molybdenum, the supporting portion 12 may be made of a material lattice-matched with the aluminum nitride and molybdenum, for example, the material of the supporting portion 12 includes gallium nitride (GaN).

Illustratively, a thickness of the first electrode 11 ranges from 1 μm to 2 μm, a thickness of the diaphragm layer 13 ranges from 1 μm to 2 μm, and a thickness of the supporting portion 12 ranges from 200 nm to 500 nm.

In some implementations, as shown in FIG. 2C, the acoustic wave transducing unit may further include: a lattice buffer layer 15, where the lattice buffer layer 15 is located between the first electrode 11 and the supporting portion 12, and an orthographic projection of the lattice buffer layer 15 on the substrate 10 covers at least an orthographic projection of the supporting portion 12 on the substrate 10. The lattice buffer layer 15 is lattice-matched with at least the supporting portion 12 to facilitate growth of the supporting portion 12. For example, the lattice buffer layer 15 is lattice-matched with both the first electrode 11 and the supporting portion 12.

For example, a material of the lattice buffer layer 15 includes zinc oxide (ZnO). A thickness of the lattice buffer layer 15 is between 80 nm and 120 nm, for example, the thickness of the lattice buffer layer is 100 nm.

In some examples, the orthographic projection of the lattice buffer layer 15 on the substrate 10 coincides with the orthographic projection of the supporting portion 12 on the substrate 10.

Table 2 shows a comparison of different materials in the Photon Energy, the lattice structure and the lattice constant, and as shown in Table 2, the lattice structures of zinc oxide, gallium nitride and aluminum nitride are the same, and the lattice constants thereof are similar. In the process of manufacturing the acoustic wave transducing unit, when the vibration chamber SP is formed by laser irradiation and wet etching, since the Photon Energy of zinc oxide is smaller than that of gallium nitride, zinc oxide is vaporized when gallium nitride is irradiated by laser, and thus in the finally formed acoustic wave transducing unit, the orthographic projection of the lattice buffer layer 15 on the substrate 10 coincides with the orthographic projection of the supporting portion 12 on the substrate 10.

TABLE 2

| | Photon Energy | Lattice structure | Lattice constant |
|---|---|---|---|
| Molybdenum | | BCC | a = 0.314 |
| Zinc oxide | 3.2 eV | wurtzite | a = 0.322 |
| Gallium nitride | 5 eV | wurtzite | a = 0.3189 |
| Aluminum nitride | 6 eV | wurtzite | a = 0.3112 |

Figure 3:
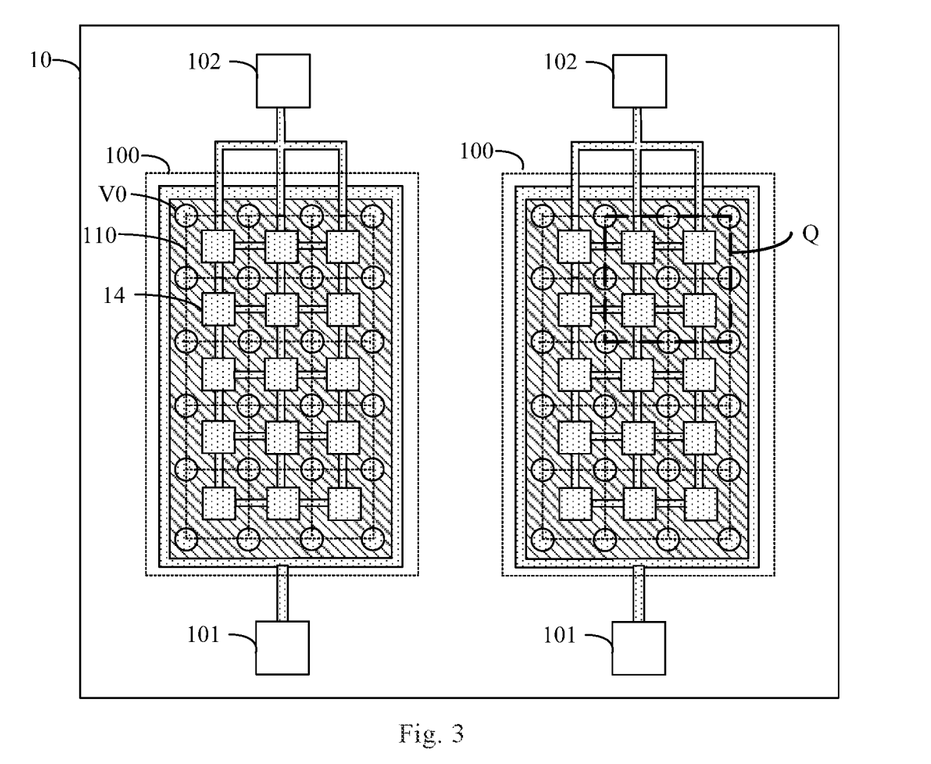
FIG. 3 is a schematic structural diagram of an acoustic wave transducer provided in some embodiments of the present disclosure.

An embodiment of the present disclosure further provides an acoustic wave transducer, FIG. 3 is a schematic structural diagram of an acoustic wave transducer provided in some embodiments of the present disclosure, and as shown in FIG. 3, the acoustic wave transducer includes: a plurality of acoustic wave transducing array element 100, each of which includes at least one acoustic wave transducing unit 110, the acoustic wave transducing unit 110 adopts the acoustic wave transducing unit provided in the foregoing embodiment, and for the specific description of the acoustic wave transducing unit, reference may be made to the corresponding contents in the foregoing embodiment, which is not described herein again.

Each acoustic wave transducing array element 100 is configured with two signal terminals, that is, a first electrical signal terminal 101 and a second electrical signal terminal 102 the first electrode 11 in the acoustic wave transducing unit 110 is electrically coupled to the first electrical signal terminal 101 of the acoustic wave transducing array element 110 to which the first electrode 11 belongs, and the second electrode 14 in the acoustic wave transducing unit 110 is electrically coupled to the second electrical signal terminal 102 of the acoustic wave transducing array element 100 to which the second electrode 14 belongs.

In some implementations, the acoustic transducing array element 100 includes a plurality of acoustic transducing units 110; first electrodes 11 of the plurality of acoustic wave transducing units 110 located in a same acoustic wave transducing array element 100 are electrically coupled together and are electrically coupled with a corresponding first electrical signal terminal 101; second electrodes 14 of the plurality of acoustic wave transducing units 110 located in a same acoustic wave transducing array element 100 are electrically coupled together and are electrically coupled with a corresponding second electrical signal terminal 102; that is, the plurality of acoustic wave transducing units 110 located in the same acoustic transducing array element 100 are coupled in parallel. The first electrodes 11 of the acoustic wave transducing units 110 located in different acoustic wave transducing array elements 100 may be disconnected or connected together, and the second electrodes 9 of the acoustic wave transducing units 110 located in different acoustic wave transducing array elements 100 are electrically insulated from each other. With the above arrangement, the plurality of acoustic wave transducing units 110 located in the same acoustic transducing array element 110 can be driven simultaneously.

It should be noted that, two acoustic wave transducing array elements 100 are exemplarily shown in FIG. 3, and each acoustic wave transducing array element 100 includes fifteen acoustic wave transducing units 110 arranged in five rows and three columns, those skilled in the art should know that the case shown in FIG. 3 is merely exemplary, and does not limit the technical solution of the present disclosure. In practical applications, the number and arrangement of the acoustic wave transducing array elements 100 and the number and arrangement of the acoustic wave transducing units 110 included in each acoustic wave transducing array element 100 can be designed according to requirements.

Figure 4:
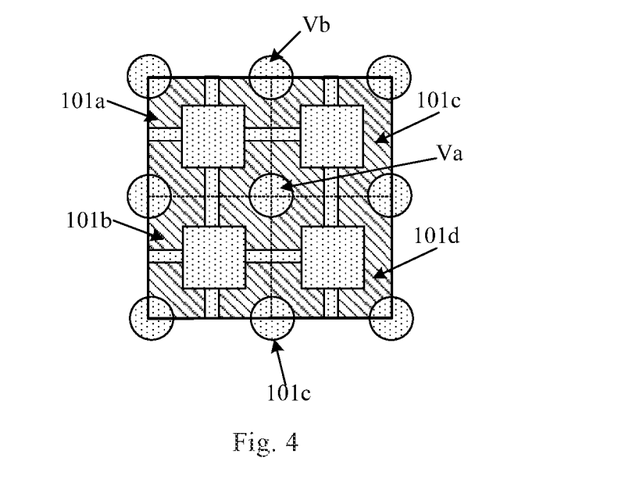
FIG. 4 is a partially enlarged view of a region Q in FIG. 3.

In some implementations, in the same acoustic wave transducing array element 100, vibration chambers SP of at least two acoustic wave transducing units 110 adjacent to each other are communicated to the same release hole V0. That is, the release hole V0 may be shared between the acoustic wave transducing units 110 adjacent to each other. FIG. 4 is a partial enlarged view of the Q region in FIG. 3, and as shown in FIG. 4, in the Q region, there are four acoustic wave transducing units 110a, 110b, 110c, 110d arranged in an array of 2×2, and the four acoustic wave transducing units 110a, 110b, 110c, 110d are adjacent to each other in different directions and share the same release hole Va. In addition, the acoustic wave transducing units 110a and 110c adjacent to each other share the same release hole Vb; the acoustic wave transducing units 110b and 110d adjacent to each other share the same release hole Vc. Certainly, the release holes V0 to which the vibration chambers SP of different acoustic wave transducing units 110 are communicated may also be independent of each other, i.e., the release hole V0 is not shared by different acoustic wave transducing units 110.

Figure 5:
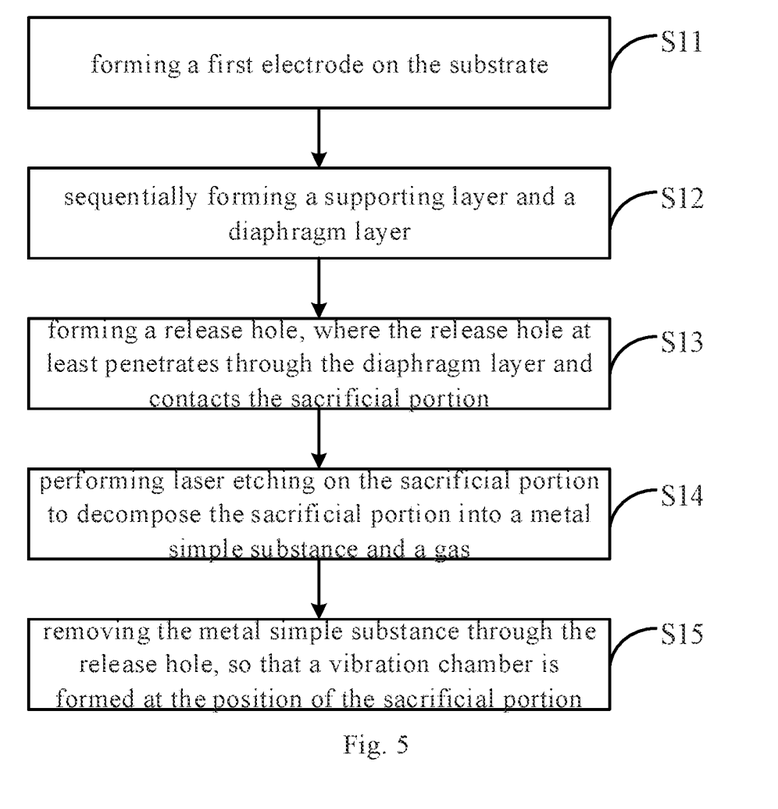
FIG. 5 is a flow chart of a method for manufacturing an acoustic wave transducing unit provided in some embodiments of the present disclosure.

FIG. 5 is a flowchart of a method for manufacturing an acoustic wave transducing unit provided in some embodiments of the present disclosure, where the acoustic wave transducing unit is the acoustic wave transducing unit in the above embodiments. As shown in FIG. 5, the method for manufacturing the acoustic wave transducing unit includes following step 11 to step 15.

At step S11, a first electrode is formed on a substrate.

In some implementations, the first electrode is made of a metal material. The step S11 may include: forming a first metal layer on the substrate, and performing a photoetching patterning process on the first metal layer to form the first electrode.

At step S12, a supporting layer and a diaphragm layer are sequentially formed, where the diaphragm layer is located on a side of the supporting layer away from the substrate, and the supporting layer is located on a side of the first electrode away from the substrate. The first electrode is lattice-matched with the supporting layer, the supporting layer is lattice-matched with the diaphragm layer, and the Photon Energy of the supporting layer is smaller than that of the diaphragm layer; the supporting layer includes a supporting portion and a sacrificial portion, and the supporting portion surrounds the sacrificial portion.

It should be noted that "lattice-matched" of two film layers in the embodiment of the present disclosure means that the lattice structures of the two film layers are the same, and the lattice coefficients of the two film layers are similar or the same, for example, a difference between the lattice constants of the two film layers is less than 0.03 nm.

At step S13, a release hole is formed, where the release hole penetrates through at least the diaphragm layer and contacts the sacrificial portion.

At step S14, laser etching is performed on the sacrificial portion to decompose the sacrificial portion into a metal simple substance and a gas.

At step S15, the metal simple substance is removed through the release hole, so that a vibration chamber is formed at the position of the sacrificial portion.

In some implementations, an etching solution may be introduced into the release hole to remove the residual metal simple substance by wet etching.

In the embodiment of the present disclosure, when the vibration chamber is formed, laser etching is performed on the sacrificial portion first, so that the sacrificial portion is decomposed into the metal simple substance and the gas (it should be noted that laser etching is an etching manner of patterning, when the laser etching is performed on a certain film layer, a portion of the film layer irradiated by laser is decomposed, and the remaining portion of the film layer not be irradiated by laser is not affected, so that the supporting portion remains unchanged when the laser etching is performed on the sacrificial portion, and the supporting portion is not irradiated by laser); then, the metal simple substance is removed through the release hole to form the vibration chamber, where the vibration chamber is surrounded by the reserved supporting portion; the laser etching does not affect the glass substrate, and the etching liquid for removing the metal simple substance does not affect the glass substrate, so that the acoustic wave transducing unit can be manufactured on the glass substrate by the manufacturing method of the embodiment of the disclosure. In addition, since the Photon Energy of the supporting layer is smaller than that of the diaphragm layer, when the sacrificial portion is irradiated by laser, the laser with a wavelength in a certain range can be selected, so that the sacrificial portion absorbs the laser with the wavelength and is decomposed; and the diaphragm layer cannot absorb the laser with the wavelength, so that the diaphragm layer cannot be influenced by the laser.

Figure 6:
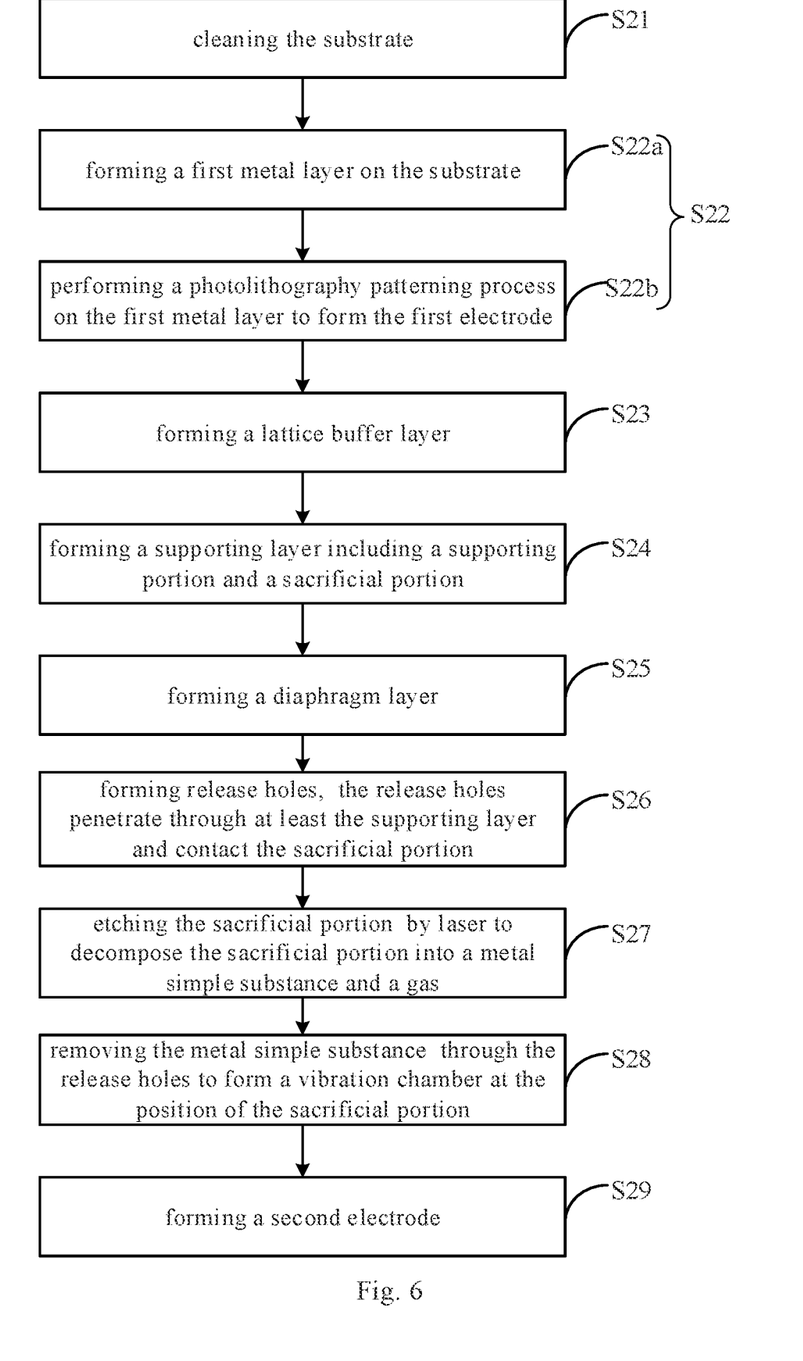
FIG. 6 is a flow chart of a method for manufacturing an acoustic wave transducing unit provided in some embodiments of the present disclosure.
Figure 7A:
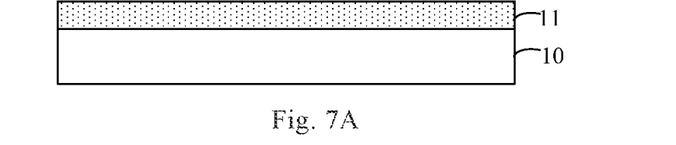
FIGS. 7A to 7H are schematic diagrams illustrating a process of manufacturing an acoustic wave transducing unit provided in some embodiments of the present disclosure.
Figure 7B:
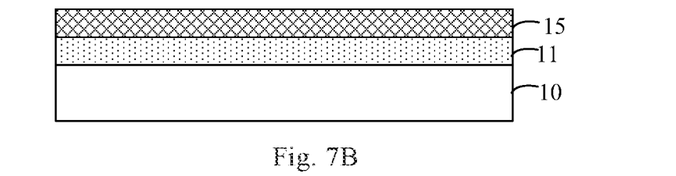
Figure 7C:
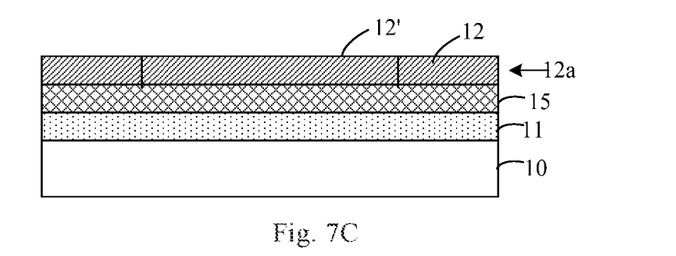
Figure 7D:
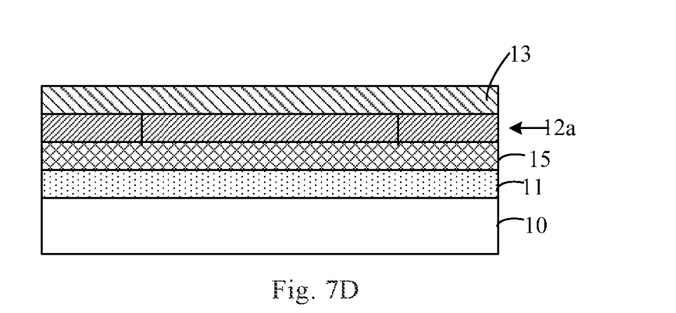
Figure 7E:
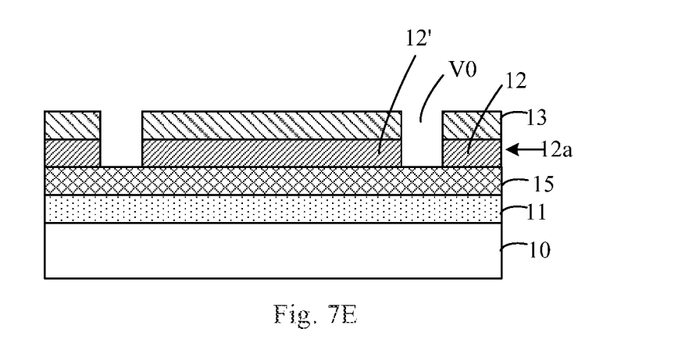
Figure 7F:
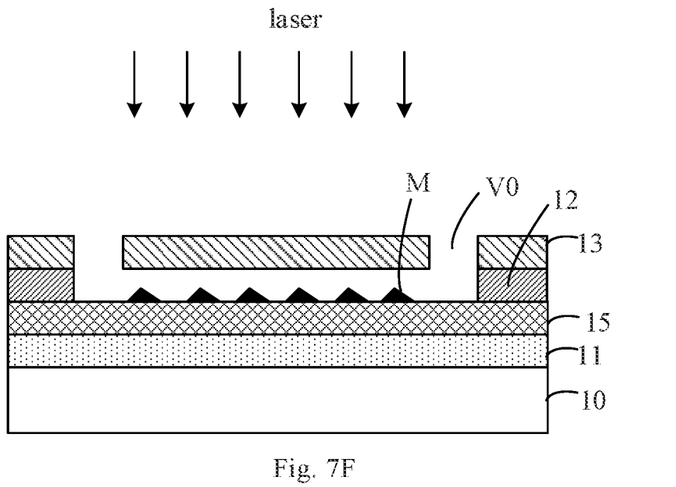
Figure 7G:
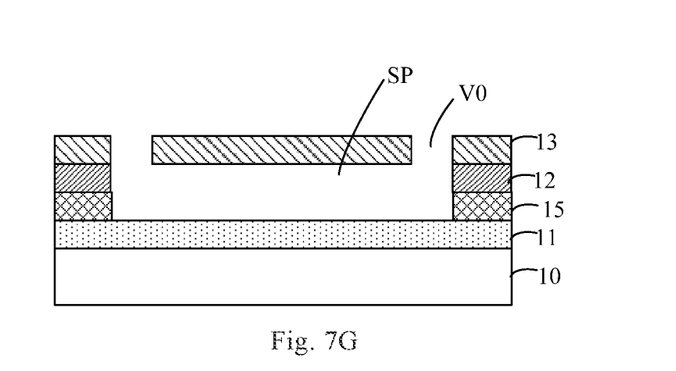
Figure 7H:
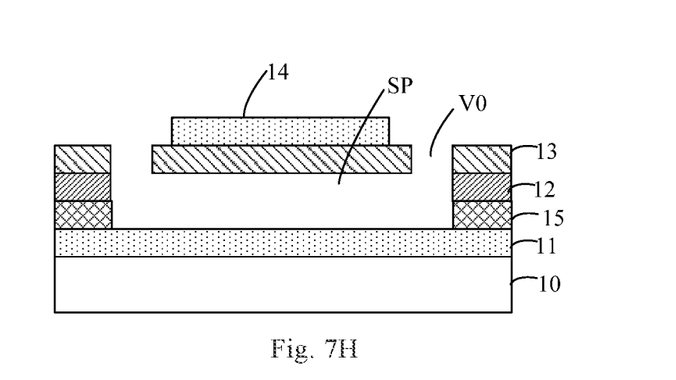

FIG. 6 is a flowchart of a method for manufacturing an acoustic wave transducing unit provided in another embodiment of the present disclosure, and FIGS. 7A to 7H are schematic diagrams of a process for manufacturing an acoustic wave transducing unit provided in another embodiment of the present disclosure, and as shown in FIGS. 6 to 7H, the method for manufacturing an acoustic wave transducing unit includes following step S21 to step S25.

At step S21, the substrate is cleaned to remove impurities on a surface of the substrate. In some implementations, the substrate is a glass substrate. For example, the substrate is cleaned at a temperature ranging from 40° C. to 70° C. for 10 minutes, and then ultrasonically cleaned with acetone, alcohol, or isopropyl alcohol (IPA) for 20 minutes.

At step S22, as shown in FIG. 7A, a first electrode 11 is formed on the substrate 10. The material of the first electrode 11 may be molybdenum (Mo), molybdenum alloy, titanium (Ti), titanium nitride (TiN x), or other metals. In a specific example, the material of the first electrode 11 includes molybdenum.

For example, step S22 includes step S22a and step S22b.

At step S22a, a first metal layer is formed on the substrate 10.

In some implementations, the first metal layer is formed using a sputtering process. For example, a direct current magnetron sputtering (DC) process or a radio frequency magnetron sputtering (RF) process may be used to form the first metal layer, and a film thickness of the first metal layer is between 1 μm and 2 μm.

Specifically, the sputtering process is performed in a sputtering chamber in which a susceptor for carrying the substrate 10 and a sputtering target are disposed. During the sputtering process, the process gas is introduced into the sputtering chamber, and a DC or RE power is applied to the sputtering target to excite the plasma to bombard the sputtering target, so that the bombarded particles of the sputtering target fall on the surface of the substrate 10 to form a thin film.

At step S22b, a photolithography patterning process is performed on the first metal layer to form the first electrode 11.

Specifically, the step S22b includes: coating a photoresist on the first metal layer, and then exposing and developing the photoresist to reserve the photoresist in a region where the first electrode is to be formed; then, etching (for example, wet etching) the first metal layer uncovered by the photoresist; and finally, removing the residual photoresist.

At step S23, as shown in FIG. 7B, a lattice buffer layer 15 is formed, where the lattice of the lattice buffer layer 15 is matched with at least that of the supporting layer subsequently formed, to facilitate the growth of the supporting layer subsequently formed. For example, the lattice buffer layer 15 is lattice-matched with both the first electrode 11 and the supporting layer subsequently formed.

For example, when the material of the first electrode 11 includes molybdenum and the material of the supporting layer subsequently formed includes gallium nitride, the material of the lattice buffer layer 15 includes zinc oxide. A thickness of the lattice buffer layer 15 is between 80 nm and 120 nm, for example, the thickness of the lattice buffer layer is 100 nm.

In some implementations, the step S23 may specifically include: forming a lattice buffer material layer through a sputtering process, and performing a patterning process on the lattice buffer material layer to form a pattern of the lattice buffer layer 15. The process of performing the patterning process on the lattice buffer material layer may refer to the above photolithography patterning process, and when the lattice buffer material layer is etched in the photolithography patterning process, dry etching may be used. The process parameters of the sputtering process for forming the lattice buffer material layer include: a vacuum degree of the sputtering chamber ranging from $4\times10^{-4}$ Pa to $6\times10^{-4}$ Pa, for example, the vacuum degree being $5\times10^{-4}$ Pa; a sputtering power ranging from 120 W to 180 W, for example, the sputtering power being 150 W; a process gas including a third inert gas (e.g., argon) having a flow rate between 10 sccm and 20 sccm, such as 15 sccm. The sputtering target is bombarded by the third inert gas to form a zinc oxide film layer on the substrate 10 by sputtering. When the lattice buffer material layer is formed by sputtering, the substrate 10 may be heated to reach a temperature ranging from 250° C. to 350° C., for example, being 300° C.; after the formation of the lattice buffer material layer, the substrate is annealed, for example, by Rapid Thermal Annealing (RTA), for about 2 min at about 400° C., so that the internal structure of the lattice buffer layer 15 reaches or approaches an equilibrium state, and good process performance and usage performance are obtained.

It should be noted that, the step S23 may also be omitted.

At step S24, as shown in FIG. 7C, a supporting layer 12a is formed, where the supporting layer 12a includes a supporting portion 12 and a sacrificial portion 12', where the supporting portion 12 surrounds the sacrificial portion 12', and the sacrificial portion 12' is removed in a subsequent manufacturing process, so that the supporting portion 12 defines a vibration chamber; an orthographic projection of the supporting portion 12 on the substrate 10 does not overlap an orthographic projection of the sacrificial portion 12' on the substrate 10. In some implementations, the material of the supporting layer 12a includes gallium nitride (GaN) and has a thickness ranging from 200 nm to 500 nm.

In some implementations, the step S24 may specifically include: forming a supporting material layer by a sputtering process, and performing a patterning process on the supporting material layer to form a pattern of the supporting layer 12a. The patterning process performed on the supporting material layer may be the above-mentioned photolithography patterning process, and in the photolithography patterning process, the etching performed on the supporting material layer may be dry etching. The process parameters of the sputtering process for forming the supporting material layer include: the vacuum degree of the sputtering chamber ranging from $1.96\times10^{-1}$ Pa to $2.00\times10^{-1}$ Pa, for example, the vacuum degree of the sputtering chamber being $1.99\times10^{-1}$ Pa; the material of the sputtering target in the sputtering chamber including gallium nitride; the sputtering power ranging from 100 W to 200 W, for example, the sputtering power being 150 W; the process gas including a first inert gas (e.g., argon) having a flow rate between 10 sccm and 50 sccm, e.g., 30 sccm. The temperature of the substrate 10 is between 250° C. and 350° C., for example, being 300° C. Alternatively, the substrate 10 may be heated during the formation of the supporting material layer, and annealed after the formation of the supporting material layer, and the annealing parameters are not limited, for example, the annealing process may be the rapid thermal annealing described above, the annealing time is about 2 min, and the annealing temperature is about 400° C.

At step S25, as shown in FIG. 7D, a diaphragm layer 13 is formed. For example, a material of the diaphragm layer 13 includes aluminum nitride (AlN).

In some implementations, a thickness of the diaphragm layer 13 ranges from 1 μm to 2 μm.

The step S25 may specifically include: forming a diaphragm material layer by adopting a sputtering process, and performing a patterning process on the diaphragm material layer to form a pattern of the diaphragm layer 13. The patterning process performed on the diaphragm material layer may be a photolithography patterning process, and the etching performed on the diaphragm material layer in the photolithography patterning process may be dry etching. Parameters of the sputtering process for forming the diaphragm material layer include: the material of the sputtering target including aluminum; the sputtering power ranging from 25 W to 100 W; the process gas including nitrogen and the second inert gas (such as argon), a flow rate of each of the nitrogen and the second inert gas ranging from 4 sccm to 6 sccm. For example, the flow rates of the nitrogen gas and the second inert gas are each 5 sccm. In some implementation, when the diaphragm material layer is formed, the substrate 10 may be heated, and annealed after the diaphragm material layer is formed, where parameters of the annealing are not limited, for example, the annealing may be the rapid thermal annealing as described above, the annealing time is about 2 min, and the annealing temperature is about 400° C.

At step S26, as shown in FIG. 7E, release holes V0 are formed, where the release holes V0 penetrate through at least the supporting layer 12a and contact the sacrificial portion 12'. The release holes V0 may be formed using a photolithography patterning process, where the diaphragm layer 13 and the supporting layer 12a may be etched using Ion Beam Etching (IBE) or RIE-ICP during etching in the photolithography patterning process to form the release holes V0 penetrating through the diaphragm layer 13 and the supporting layer. In some examples, the number of the release holes V0 is plural, for example, four.

At step S27, as shown in FIG. 7F, the sacrificial portion 12' is etched by laser to decompose the sacrificial portion 12' into a metal simple substance M and a gas.

In some implementations, the lattice buffer layer 15 is made of zinc oxide, the sacrificial layer 12' is made of gallium nitride, and the diaphragm layer 13 is made of aluminum nitride. As can be seen from Table 2 above, the Photon Energy of gallium nitride is larger than that of zinc oxide and smaller than that of aluminum nitride; during etching the sacrificial portion 12' by laser, laser with a wavelength in a certain range may be selected such that the sacrificial portion 12' is decomposed, while the aluminum nitride is not affected by the laser. For example, the wavelength of the laser used in step S27 ranges from 245 nm to 250 nm, and an energy density of the laser ranges from 1.0 $J/cm^2$ to 1.5 $J/cm^2$. It is understood that, since the Photon Energy of the lattice buffer layer 15 is smaller than that of the sacrificial portion 12', when the sacrificial portion 12' is etched by laser, at least a portion of the lattice buffer layer 15 facing the sacrificial portion 12' absorbs the laser and is vaporized. In some examples, after the sacrificial portion 12' is etched by laser, the portion of the lattice buffer layer 15 facing the sacrificial portion 12' is completely vaporized, so that an orthographic projection of the remaining lattice buffer layer 15 on the substrate 10 coincides with an orthographic projection of the supporting portion 12 on the substrate 10.

At step S28, the metal simple substance M is removed through the release holes V0 to form a vibration chamber SP at the position of the sacrificial portion 12', as shown in FIG. 7G.

In some implementations, the step S28 includes: introducing etching liquid into the release holes V0 to etch away the metal simple substance. For example, the etching liquid is hydrochloric acid (HCL).

At step S29, as shown in FIG. 7H, a second electrode 14 is formed. For example, a material of the second electrode 14 may include molybdenum. The step of forming the second electrode 14 may be the same as the step of forming the first electrode 11.

In the above embodiment, the patterning process for the supporting material layer, the patterning process for the lattice buffer material layer, and the patterning process for the diaphragm material layer are performed separately and are performed before the release holes are formed; in other implementations, the supporting material layer, the lattice buffer layer and the diaphragm material layer may be subjected to a patterning process at the same time, and the supporting material layer, the lattice buffer layer and the diaphragm material layer may be subjected to a patterning process at the same time as the release holes are formed.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

The invention claimed is:

1. A method for manufacturing an acoustic wave transducing unit, comprising:
    forming a first electrode on a substrate;
    sequentially forming a supporting layer and a diaphragm layer, wherein the supporting layer is located on a side of the first electrode away from the substrate, and the diaphragm layer is located on a side of the supporting layer away from the substrate;
    the first electrode is lattice-matched with the supporting layer, the supporting layer is lattice-matched with the diaphragm layer, and a Photon Energy of the supporting layer is smaller than that of the diaphragm layer; the supporting layer comprises a sacrificial portion and a supporting portion surrounding the sacrificial portion;
    forming a release hole, wherein the release hole penetrates through at least the diaphragm layer and is in contact with the sacrificial portion;
    performing a laser etching on the sacrificial portion to decompose the sacrificial portion into a metal simple substance and a gas; and
    removing the metal simple substance through the release hole so as to form a vibration chamber at a position of the sacrificial portion.

2. The method of claim 1, wherein the substrate is a glass substrate, a material of the first electrode comprises molybdenum, a material of the supporting layer comprises gallium nitride, and a material of the diaphragm layer comprises aluminum nitride.

3. The method of claim 2, wherein during performing the laser etching on the sacrificial portion, a laser having a wavelength ranging from 245 nm to 250 nm and an energy density ranging from 1.0 J/cm2 to 1.5 J/cm2 is used.

4. The method of claim 2, wherein the forming the supporting layer comprises: forming a supporting material layer by adopting a sputtering process, and performing a patterning process on the supporting material layer to form a pattern of the supporting layer;
    parameters of the sputtering process for forming the supporting material layer comprise:
    a material of a sputtering target comprising gallium nitride;
    a sputtering power ranging from 100 W to 200 W;
    a process gas comprising a first inert gas, and a flow rate of the first inert gas ranging from 10 sccm to 50 sccm.

5. The method of claim 2, wherein the forming the diaphragm layer comprises: forming a diaphragm material layer by adopting a sputtering process, and performing a patterning process on the diaphragm material layer to form a pattern of the diaphragm layer;
    parameters of the sputtering process for forming the diaphragm material layer comprise:
    a material of a sputtering target comprising aluminum;
    a sputtering power ranging from 25 W to 100 W;
    a process gas comprising nitrogen and a second inert gas, both of which having a flow rate ranging from 4 sccm to 6 sccm.

6. The method of claim 2, wherein the removing the metal simple substance through the release hole comprises:
    introducing etching liquid into the release hole to etch away the metal simple substance.

7. The method of claim 1, wherein the removing the metal simple substance through the release hole comprises:
    introducing etching liquid into the release hole to etch away the metal simple substance.

8. The method of claim 1, further comprising: forming a lattice buffer layer between the supporting layer and the first electrode, the lattice buffer layer being lattice-matched with at least the supporting layer.

9. The method of claim 8, wherein a material of the lattice buffer layer comprises zinc oxide.

10. The method of claim 9, wherein forming the lattice buffer layer comprises: forming a lattice buffer material layer by adopting a sputtering process, and performing a patterning process on the lattice buffer material layer to form a pattern of the lattice buffer layer;
    parameters of the sputtering process for forming the lattice buffer material layer comprise:
    a material of a sputtering target comprising zinc oxide;
    a sputtering power ranging from 100 W to 150 W;
    a process gas comprising a third inert gas, and a flow rate of the third inert gas ranging from 10 sccm to 20 sccm.

* * * * *